US012586831B2

(12) United States Patent (10) Patent No.: US 12,586,831 B2

Nakamura et al. (45) Date of Patent: Mar. 24, 2026

(54) ELECTRIC POWER DEMAND ADJUSTING DEVICE

(71) Applicant: Prime Planet Energy & Solutions, Inc., Tokyo (JP)

(72) Inventors: Kohki Nakamura, Okazaki (JP); Keiichi Ito, Kasai (JP); Kimihiko Furukawa, Kakogawa (JP); Shinya Inui, Kakogawa (JP); Noriharu Kobayashi, Kakogawa (JP); Masaki Yugou, Kakogawa (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 612 days.

(21) Appl. No.: 18/063,684

(22) Filed: Dec. 9, 2022

(65) Prior Publication Data

US 2023/0187719 A1      Jun. 15, 2023

(30) Foreign Application Priority Data

Dec. 14, 2021      (JP) ................................. 2021-202641

(51) Int. Cl.
| | | |
|---|---|---|
| *H01M 10/48* | (2006.01) | |
| *G01R 31/36* | (2020.01) | |
| *G01R 31/392* | (2019.01) | |
| *H01M 10/05* | (2010.01) | |
| *H01M 10/44* | (2006.01) | |

(52) U.S. Cl.
CPC ...... *H01M 10/484* (2013.01); *G01R 31/3648* (2013.01); *G01R 31/392* (2019.01); *H01M 10/05* (2013.01); *H01M 10/44* (2013.01)

(58) Field of Classification Search
None
See application file for complete search history.

(56) References Cited

U.S. PATENT DOCUMENTS

| | | | |
|---|---|---|---|
| 2014/0225571 A1 | 8/2014 | Obata et al. | |
| 2017/0151880 A1 | 6/2017 | Nakashima et al. | |
| 2017/0190258 A1 | 7/2017 | Hashimoto | |
| 2018/0134173 A1 | 5/2018 | Takebayashi et al. | |
| 2019/0285702 A1* | 9/2019 | Tashiro .............. | G01R 31/3648 |
| 2020/0313436 A1* | 10/2020 | Tsuda .................... | H02J 7/0063 |
| 2023/0231209 A1* | 7/2023 | Yamagami ........... | G01R 31/389 |
| | | | 320/134 |
| 2023/0324471 A1* | 10/2023 | Umemoto ............ | G01R 31/396 |
| | | | 702/63 |

FOREIGN PATENT DOCUMENTS

| | | | |
|---|---|---|---|
| JP | 2017103080 A | 6/2017 | |
| JP | 2017123245 A | 7/2017 | |
| JP | 201881807 A | 5/2018 | |
| JP | 2020162304 A | 10/2020 | |
| WO | 2013046263 A1 | 4/2013 | |

* cited by examiner

*Primary Examiner* — Kevin M Bernatz

(74) *Attorney, Agent, or Firm* — HAUPTMAN HAM, LLP

(57) ABSTRACT

An electric power demand adjusting device is configured to execute an acquiring process of acquiring an evaluation value ΣD for a high-rate deterioration of a secondary battery connected to a power utility grid, which results from a salt concentration unevenness in an electrolyte solution, and a discharge non-participating process of not allowing the secondary battery to participate in adjustment of discharge demand from the power utility grid when the evaluation value ΣD of the secondary battery is greater than or equal to a predetermined discharge threshold value K1.

8 Claims, 5 Drawing Sheets

ELECTRIC POWER DEMAND ADJUSTING DEVICE

CROSS REFERENCE TO RELATED APPLICATIONS

The present application claims priority from Japanese Patent Application No. 2021-202641 filed on Dec. 14, 2021, which is incorporated by reference herein in its entirety.

BACKGROUND

The present invention relates to an electric power demand adjusting device.

JP 2020-162304A, for example, discloses a battery control system. This battery control system includes a storage battery that is connected to a power grid network to charge and discharge electric power, and a control device that controls charging and discharging of the storage battery.

The control device changes contents of the control for charging and discharging of the storage battery when the deterioration state of the storage battery satisfies a predetermined condition. The control device is configured to control the charging and discharging so as to suppress deterioration of the storage battery when the storage battery is used for a predetermined time or longer. This makes it possible to improve the economics of the consumer who owns the storage battery.

SUMMARY

A secondary battery, such as the storage battery disclosed in JP 2020-162304 A, may cause salt concentration unevenness in the electrolyte solution and a consequent increase in the internal resistance due to, for example, excessive charging and discharging, and as a consequence, the secondary battery may deteriorate. Such a deterioration of the secondary battery resulting from the salt concentration unevenness in the electrolyte solution is called a high-rate deterioration. When the secondary battery is repeatedly charged and discharged without taking into consideration such a high-rate deterioration, there is a risk that the high-rate deterioration is accelerated.

According to an embodiment of the present disclosure, an electric power demand adjusting device is configured to execute: an acquiring process of acquiring an evaluation value for a high-rate deterioration of a secondary battery connected to a power utility grid, the high-rate deterioration resulting from a salt concentration unevenness in an electrolyte solution of the secondary battery; and a discharge non-participating process of not allowing the secondary battery to participate in adjustment of discharge demand in the power utility grid when the evaluation value of the secondary battery is greater than or equal to a predetermined discharge threshold value. For example, when the evaluation value for the high-rate deterioration is great, the secondary battery is in an excessively discharged state. If the excessively discharged secondary battery is further discharged, the high-rate deterioration is likely to be accelerated. Therefore, in this embodiment, when the evaluation value is greater than or equal to the discharge threshold value, the secondary battery is not allowed to participate in the adjustment of discharge demand in the power utility grid, to thereby reduce the high-rate deterioration of the secondary battery.

In another embodiment proposed herein, an electric power demand adjusting device may be configured to further execute a charge non-participating process of not allowing the secondary battery to participate in adjustment of charge demand in the power utility grid when the evaluation value of the secondary battery is less than or equal to a predetermined charge threshold value.

In another embodiment of the electric power demand adjusting device proposed herein, the acquiring process may include acquiring a discharge evaluation value and a charge evaluation value of the secondary battery, the discharge evaluation value being the evaluation value on a discharge side and the charge evaluation value being the evaluation value on a charge side. In the discharge non-participating process, the secondary battery may not be allowed to participate in the adjustment of discharge demand in the power utility grid when the discharge evaluation value is greater than or equal to the discharge threshold value. In the charge non-participating process, the secondary battery may not be allowed to participate in the adjustment of charge demand in the power utility grid when the charge evaluation value is less than or equal to the charge threshold value.

In another embodiment of the present disclosure, an electric power demand adjusting device is configured to execute: an acquiring process of acquiring an evaluation value for a high-rate deterioration of a secondary battery connected to a power utility grid, the high-rate deterioration resulting from a salt concentration unevenness in an electrolyte solution of the secondary battery; and a charge non-participating process of not allowing the secondary battery to participate in adjustment of charge demand in the power utility grid when the evaluation value of the secondary battery is less than or equal to a predetermined charge threshold value. For example, when the evaluation value for the high-rate deterioration is low, the secondary battery is in an excessively charged state. If the excessively charged secondary battery is further charged, high-rate deterioration is likely to be accelerated. Therefore, in this embodiment, when the evaluation value is less than or equal to the charge threshold value, the secondary battery is not allowed to participate in the adjustment of charge demand in the power utility grid, to thereby reduce the high-rate deterioration of the secondary battery.

In another embodiment of the present disclosure, an electric power demand adjusting device is configured to execute: an acquiring process of acquiring an evaluation value for a high-rate deterioration of each of a plurality of secondary batteries connected to a power utility grid, the high-rate deterioration resulting from a salt concentration unevenness in an electrolyte solution of each of the secondary batteries; and a discharge participating process of allowing one or more of the plurality of secondary batteries having an evaluation value less than a predetermined discharge threshold value to participate in adjustment of discharge demand in the power utility grid. When the evaluation value is less than the discharge threshold value, it means that the secondary battery is not excessively discharged. For this reason, when the evaluation value is less than the discharge threshold value, the secondary battery is allowed to participate in the adjustment of discharge demand in the power utility grid, so that the secondary battery can be allowed to discharge while reducing the high-rate deterioration.

In another embodiment proposed herein, an electric power demand adjusting device may be configured to further execute a charge participating process of allowing one or more of the plurality of secondary batteries having an evaluation value greater than or equal to the discharge threshold value to participate in the adjustment of charge demand in the power utility grid.

In another embodiment of the electric power demand adjusting device proposed herein, the charge participating process may allow one or more secondary batteries having an evaluation value greater than a predetermined charge threshold value to participate in the adjustment of charge demand in the power utility grid.

In another embodiment of the present disclosure, an electric power demand adjusting device is configured to execute: an acquiring process of acquiring an evaluation value for a high-rate deterioration of each of a plurality of secondary batteries connected to a power utility grid, the high-rate deterioration resulting from a salt concentration unevenness in an electrolyte solution of each of the secondary batteries; and a charge participating process of allowing one or more of the plurality of secondary batteries having an evaluation value less than a predetermined charge threshold value to participate in adjustment of charge demand in the power utility grid. When the evaluation value is greater than the charge threshold value, it means that the secondary battery is not excessively charged. For this reason, when the evaluation value is greater than the charge threshold value, the secondary battery is allowed to participate in the adjustment of charge demand in the power utility grid, so that the secondary battery can be charged while reducing the high-rate deterioration.

In another embodiment proposed herein, the electric power demand adjusting device may be configured to further execute a discharge participating process of allowing one or more of the plurality of secondary batteries having an evaluation value less than or equal to the charge threshold value to participate in the adjustment of discharge demand in the power utility grid.

DETAILED DESCRIPTION

Hereinbelow, embodiments of the electric power demand adjusting device according to the present disclosure will be described with reference to the drawings. It should be noted, however, that the disclosed embodiments are, of course, not intended to limit the invention. The present invention is not limited to the embodiments described herein unless specifically stated otherwise. The features and components that exhibit the same effects are designated by the same reference symbols as appropriate, and the description thereof will not be repeated as appropriate.

Figure 1:
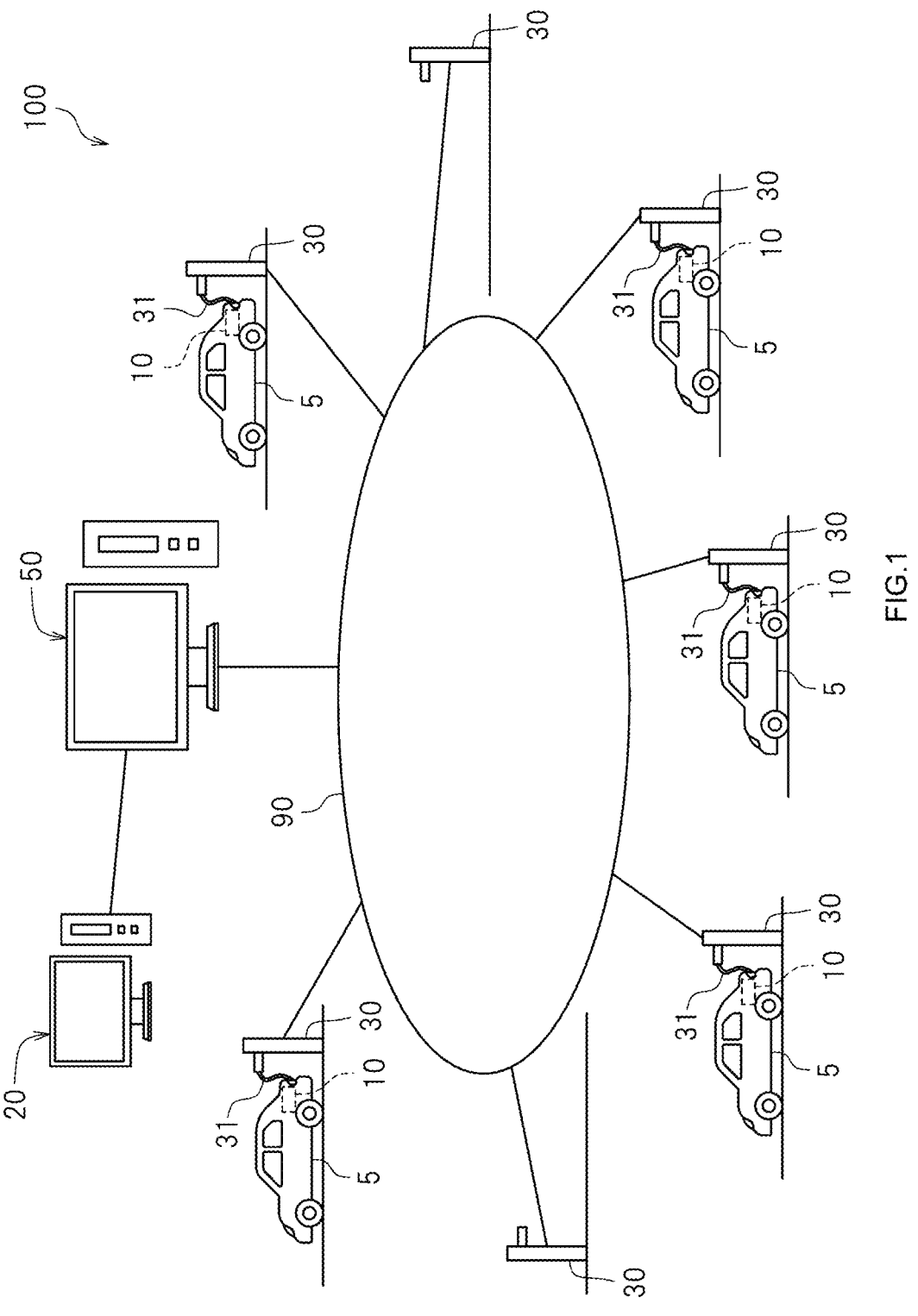
FIG. 1 is a schematic illustrative view illustrating an electric power demand adjusting system according to an embodiment of the disclosure.
Figure 2:
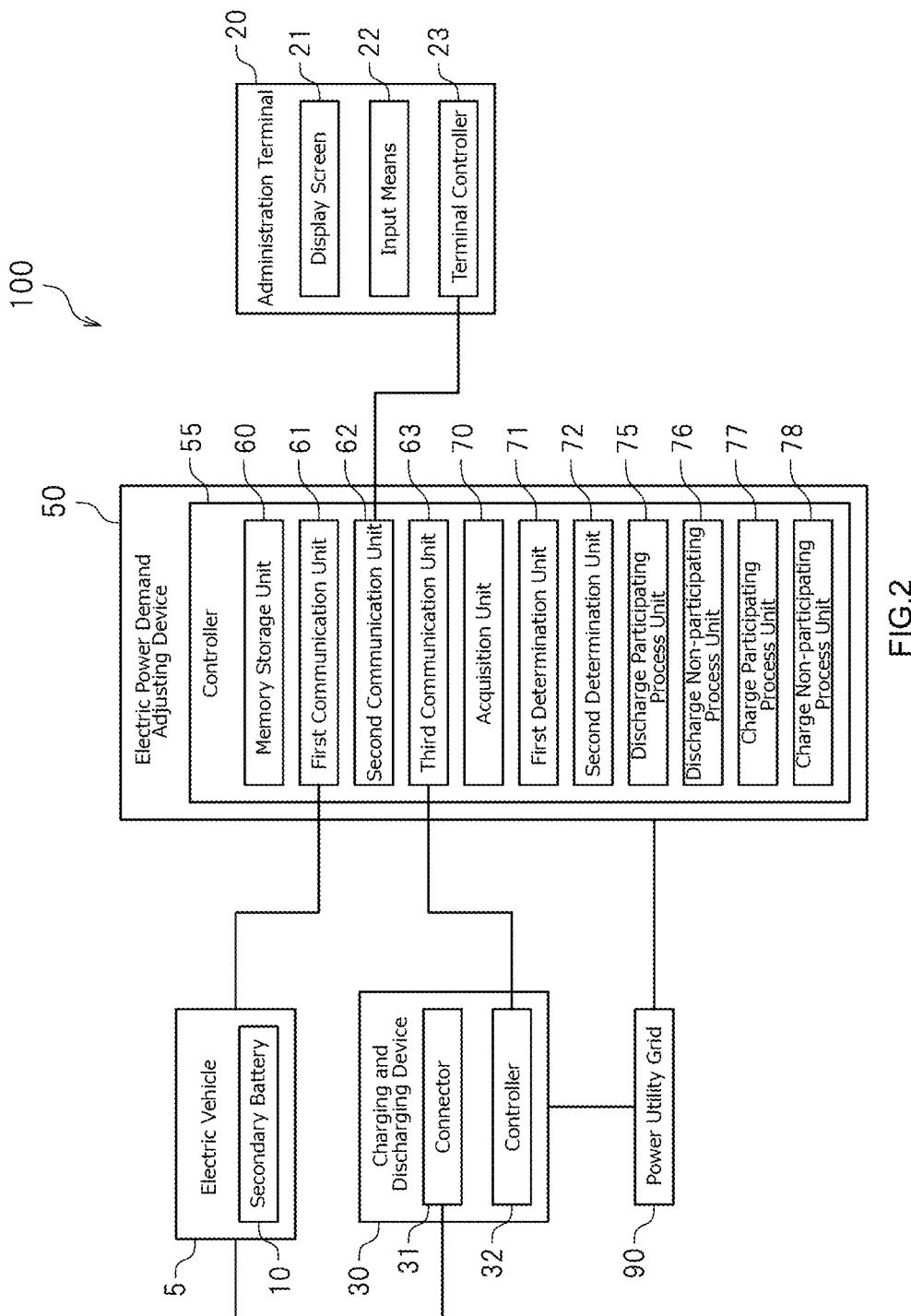
FIG. 2 is a block diagram illustrating the electric power demand adjusting system according to an embodiment of the disclosure.

FIG. 1 is a schematic illustrative view illustrating an electric power demand adjusting system 100 according to the present embodiment, which includes an electric power demand adjusting device 50. FIG. 2 is a block diagram illustrating the electric power demand adjusting system 100. The electric power demand adjusting device 50 according to the present embodiment is a device that controls charging and discharging of a secondary battery 10 to adjust electric power of a power utility grid 90.

Herein, the secondary battery 10 refers to a repeatedly chargeable electricity storage device in general, which is intended to encompass what is called storage batteries, such as lithium-ion secondary batteries, nickel-metal hydride batteries, and nickel-cadmium batteries. In the present embodiment, the secondary battery 10 is a lithium-ion secondary battery, but the secondary battery 10 is not limited to a lithium-ion secondary battery.

Although not shown in detail, the secondary battery 10 includes a case, an electrode assembly enclosed in the case, and an electrolyte solution enclosed in the case. The electrode assembly includes a positive electrode sheet serving as a positive electrode element, a negative electrode sheet serving as a negative electrode element, and a separator sheet interposed between the positive electrode sheet and the negative electrode sheet. The electrolyte solution may be, for example, a non-aqueous electrolyte solution in which a supporting salt is dissolved in a non-aqueous solvent. Examples of the non-aqueous solvent include carbonate-based solvents, such as ethylene carbonate, dimethyl carbonate, and ethyl methyl carbonate. Examples of the supporting salt include fluorine-containing lithium salts, such as $LiPF_6$.

In the present embodiment, the secondary battery 10 is a battery mounted in an electric vehicle 5, which is commonly called an on-board battery. The electric vehicle 5 travels using the electric power obtained from the secondary battery 10 as its energy source. Examples of the electric vehicle 5 include vehicles that use electric power as their energy source, such as electric vehicles, hybrid vehicles, and plug-in hybrid electric vehicles. The electric vehicle 5 may be a four-wheeled vehicle or a two-wheeled vehicle. The number of secondary batteries 10 to be mounted in the electric vehicle 5 is not limited, and a plurality of secondary batteries 10 may be mounted in the electric vehicle 5. The secondary battery 10 is not limited to an on-board battery, but may be a storage battery to be used in homes, for example.

In the present embodiment, the electric power demand adjusting device 50 is included in the electric power demand adjusting system 100. The electric power demand adjusting system 100 is a system that controls charging and discharging of the electric vehicle 5 to adjust electric power of the power utility grid 90. As illustrated in FIG. 1, the electric power demand adjusting system 100 includes an administration terminal 20, a plurality of charging and discharging devices 30, each of which may charge and discharge the secondary battery 10 mounted in the electric vehicle 5, and an electric power demand adjusting device 50, which controls the charging and discharging devices 30. Although not shown in the drawings, the electric power demand adjusting system 100 also includes an electricity storage device that stores electric power of the power utility grid 90.

The plurality of charging and discharging devices 30 are connected to the electricity storage device so as to be able to charge and discharge the electricity storage device. The electric power demand adjusting system 100 manages charging of the electric power stored in the electricity storage device into the secondary battery 10 of the electric vehicle 5, and storing of the electric power discharged from the secondary battery 10 into the electricity storage device, in response to the electric power demand from the power utility grid 90. Note that the electric power stored in the electricity storage device of the power utility grid 90 is sold to a certain business operator, such as a power utility company. The electric power demand adjusting system 100 may be a system that is used for selling and purchasing electric power, i.e., sales of electricity and purchases of electricity.

Herein, a person or entity that manages the electric power demand adjusting system 100 is referred to as a system administrator. The system administrator may also be called an aggregator. The system administrator controls the demand for electric power so as to maintain a balance between supply and demand of electric power in the power utility grid 90. In order to provide a sufficient amount of electric energy, it is preferable that the system administrator make a contract with a greater number of users of electric vehicles 5 and manage a greater number of charging and discharging devices 30.

The electric power demand adjusting system 100 is a system that accomplishes what is called a V2G (vehicle-to-grid), which supplies electric power from the electric vehicles 5 to the power utility grid 90. In the electric power demand adjusting system 100, a plurality of electric vehicles 5 that participate in the V2G are registered. Each of the secondary batteries 10 mounted in the electric vehicles 5 participating in the V2G may be capable of undergoing repeated charging and discharging in order to respond to electric power demand. The electric power demand adjusting system 100 also manages a plurality of charging and discharging devices 30. The electric power demand adjusting system 100 manages electric power in the power utility grid 90 by supplying electric power from the electric vehicle 5 to the charging and discharging device 30 in response to a discharge demand (i.e., a discharging request) from the power utility grid 90 to the electric vehicle 5 and by supplying electric power from the charging and discharging device 30 to the electric vehicle 5 in response to a charge demand (i.e., a charging request) from the power utility grid 90 to the electric vehicle 5.

Herein, the power utility grid 90 is composed of various types of electrical equipment such as for performing power generation, power transmission, power transformation, power distribution, and the like. The power utility grid 90 supplies electric power to consumers' electric facilities in response to electric power demand. The amount of electric energy is adjusted so as to maintain a balance between supply and demand. Such adjustment of electric power supply and demand may be managed by the system administrator that is an aggregator. The system administrator may issue an instruction on charging and discharging to the power utility grid 90 through the electric power demand adjusting device 50. Herein, charging and discharging of the secondary battery 10 are controlled in response to the electric power demand in the power utility grid 90. For example, when the demand from the power utility grid 90 is a discharge demand, it means that a power shortage occurs in the power utility grid 90. Accordingly, the power utility grid 90 is controlled so as to cause discharging from the secondary battery 10. As a result, electric power is supplied to the power utility grid 90. On the other hand, when the demand from the power utility grid 90 is a charge demand, it means that there is a surplus of electric power in the power utility grid 90. Accordingly, the power utility grid 90 is controlled so as to cause charging to the secondary battery 10. As a result, electric power is discharged from the power utility grid 90.

The administration terminal 20 is a terminal device used by a system administrator (for example, an aggregator). The system administrator uses the administration terminal 20 to be able to comprehend the electric power demand from the power utility grid 90. Also, the system administrator uses the administration terminal 20 to be able to instruct the power utility grid 90 to perform charging and discharging from the electric vehicle 5 to the power utility grid 90. The administration terminal 20 is implemented by, for example, a desktop-type or laptop-type personal computer. Of course, it is also possible that the administration terminal 20 may be implemented by a smartphone or a tablet terminal device. The administration terminal 20 includes a display screen 21, an input means 22 operated by the system administrator to provide an input, such as a keyboard, a mouse, or a touch screen, and a terminal controller 23. The terminal controller 23 is communicably connected to the display screen 21 and the input means 22.

The charging and discharging device 30 is a device for charging and discharging the secondary battery 10 of the electric vehicle 5. The charging and discharging device 30 is installed in, for example, a charging spot provided at households, business facilities, commercial facilities, hospitals, gas stations, car dealers, and so forth. As illustrated in FIG. 2, the charging and discharging device 30 includes a connector 31 and a controller 32. The controller 32 may be, for example, a microcomputer.

As illustrated in FIG. 1, the connector 31 of the charging and discharging device 30 may be connected to the electric vehicle 5. The charging and discharging device 30 is configured to be able to charge and discharge the secondary battery 10 via the connector 31. The connector 31 may be, but is not limited to, a charging/discharging cable, for example. The charging and discharging device 30 is configured to be able to supply electric power from the secondary battery 10 to the power utility grid 90 via the connector 31. The electric vehicle 5 may be connected to the power utility grid 90 via the charging and discharging device 30.

When the secondary battery 10 mounted in the electric vehicle 5 undergoes, for example, excessive charging and discharging, the salt concentration in the electrolyte solution of the secondary battery 10 may result in an unevenness with respect to a predetermined concentration. When the salt concentration unevenness occurs, the internal resistance of the secondary battery 10 may increase, and the secondary battery 10 may deteriorate. Such a deterioration of the secondary battery 10 resulting from the salt concentration unevenness in the electrolyte solution of the secondary battery 10 is called a high-rate deterioration. Note that the high-rate deterioration is a reversible deterioration, unlike a deterioration over time, such as a so-called material deterioration. In the high-rate deterioration, the secondary battery 10 expands or contracts due to charging and discharging with high current, and as a consequence, the electrolyte solution temporarily moves within the electrode assembly of the secondary battery 10 and results in partial regions with a higher salt concentration and a lower salt concentration, causing a salt concentration unevenness. For this reason, when the secondary battery 10 is allowed to stand still for a certain time without charging and discharging or when the charge-discharge current is controlled to be low, the electrolyte solution permeates in a direction such that the salt concentration becomes uniform, and consequently, the salt concentration unevenness is recovered. The rate at which the salt concentration is recovered may vary depending on temperature conditions. For example, when the temperature is lower, the viscosity of the electrolyte solution is higher, so the recovery from the salt concentration unevenness is slower. On the other hand, when the temperature is higher, the viscosity of the electrolyte solution is lower, so the recovery from the salt concentration unevenness is quicker. When the high-rate deterioration worsens, the charge-discharge efficiency may reduce because of the increased internal resistance. For this reason, it is desirable to reduce the high-rate deterioration. In addition, when the secondary battery 10 is repeatedly charged and discharged without considering such a high-rate deterioration, the high-rate deterioration may be accelerated. For this reason as well, it is desirable to reduce the high-rate deterioration.

For that reason, in the present embodiment, the electric power demand adjusting device 50 controls, while considering the high-rate deterioration, charging and discharging of secondary batteries 10 that are connected to the power utility grid 90 and receive a charging request or a discharging request from the power utility grid 90. The electric power demand adjusting device 50 controls, while considering the high-rate deterioration, charging and discharging of a secondary battery 10 of an electric vehicle 5 in response to the electric power demand in the power utility grid 90. The electric power demand adjusting device 50 may be implemented by either a single computer or a plurality of computers in cooperation with each other. The electric power demand adjusting device 50 is managed by the system administrator of the electric power demand adjusting system 100.

The electric power demand adjusting device 50 is communicably connected to the electric vehicles 5, the administration terminal 20, the charging and discharging devices 30, and the power utility grid 90 via a network such as the Internet. The electric power demand adjusting device 50 includes a controller 55. Although not shown in the drawings, the electric power demand adjusting device 50 may also include a display screen and an input means, similar to the administration terminal 20.

The configuration of the controller 55 is not limited to any particular configuration. Herein, the controller 55 may be, for example, a microcomputer. The controller 55 includes, for example, an I/F, a CPU, a ROM, and a ROM. As illustrated in FIG. 2, the controller 55 includes a memory storage unit 60, a first communication unit 61, a second communication unit 62, and a third communication unit 63. The controller 55 further includes an acquisition unit 70, a first determination unit 71, a second determination unit 72, a discharge participating process unit 75, a discharge non-participating process unit 76, a charge participating process unit 77, and a charge non-participating process unit 78. These various units 61 to 78 of the controller 55 may be implemented by a single processor or a plurality of processors, or may be incorporated in a circuit.

The first communication unit 61 is configured to be communicable with the electric vehicle 5. The second communication unit 62 is configured to be communicable with the administration terminal 20 used by the system administrator. Herein, the second communication unit 62 is configured to be communicable with the terminal controller 23 of the administration terminal 20. The third communication unit 63 is configured to be communicable with the charging and discharging device 30. Herein, the third communication unit 63 is configured to be communicable with the controller 32 of the charging and discharging device 30.

Figure 3:
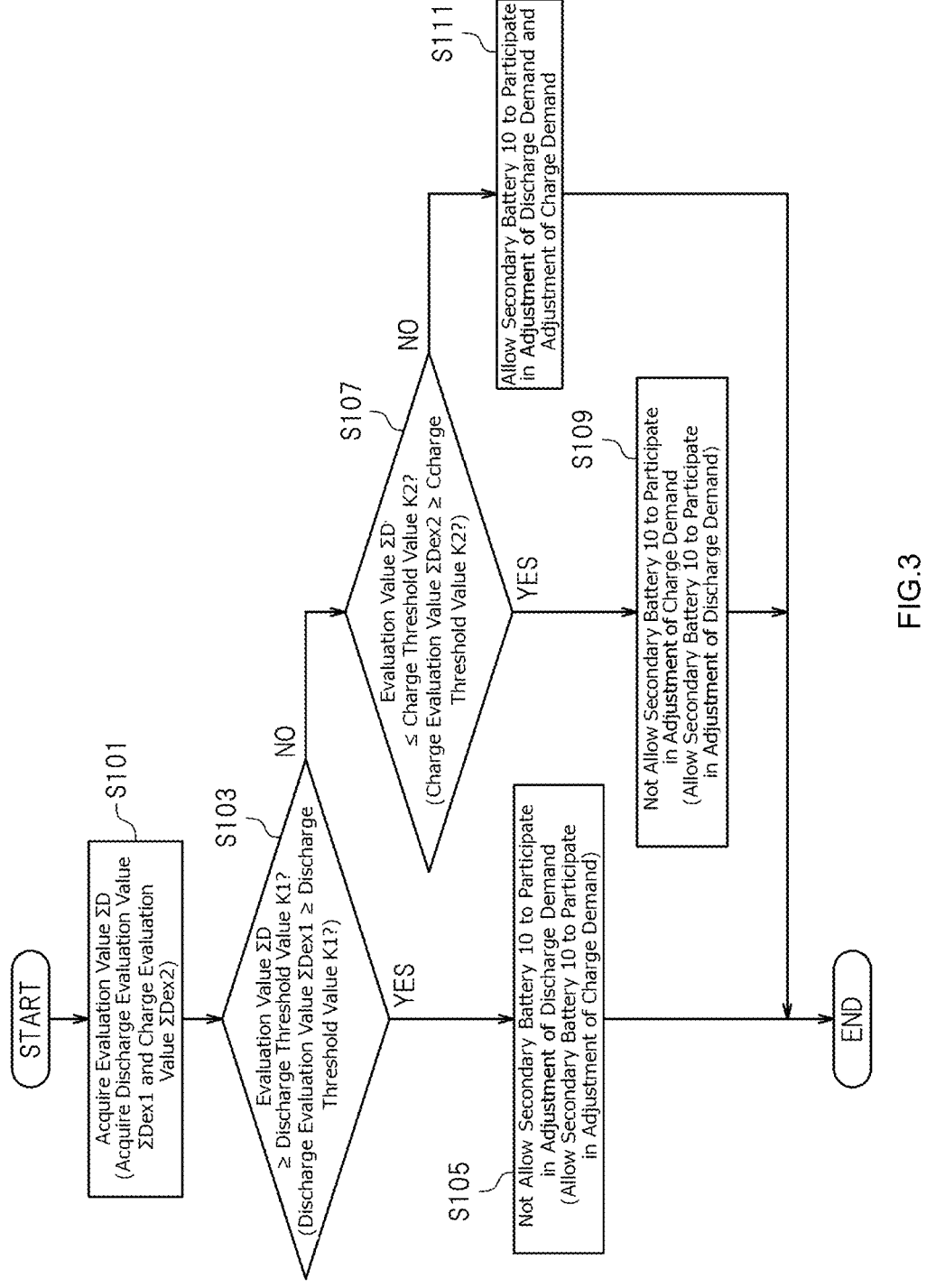
FIG. 3 is a flowchart illustrating the procedure of controlling charging and discharging of a secondary battery mounted in an electric vehicle while taking evaluation values for the high-rate deterioration into consideration.

Next, the description explains the procedure of controlling charging and discharging of the secondary batteries 10 mounted in the electric vehicles 5 according to an electric power demand (for example, a discharge demand and a charge demand) from the power utility grid 90 while considering the high-rate deterioration, with reference to the flowchart of FIG. 3. Here, as illustrated in FIG. 1, charging and discharging of the secondary batteries 10 are controlled for the electric vehicles 5 connected to the power utility grid 90, according to the electric power demand of the electric vehicles 5 connected to the connectors 31 of the charging and discharging devices 30, that is, the electric power demand of the power utility grid 90.

First, at step S101 of FIG. 3, the acquisition unit 70 of FIG. 2 acquires an evaluation value $\Sigma D$ of a secondary battery 10 connected to the power utility grid 90. Herein, the evaluation value $\Sigma D$ is an evaluation value for the high-rate deterioration resulting from a salt concentration unevenness in the electrolyte solution of the secondary battery 10. The acquisition unit 70 acquires the evaluation value $\Sigma D$ for the secondary batteries 10 of all the electric vehicles 5 connected to the power utility grid 90, i.e., connected to the charging and discharging devices 30.

The method for obtaining the evaluation value $\Sigma D$ is not limited to a particular method, and any conventionally known method may be used. For example, the evaluation value $\Sigma D$ may be obtained by the technique disclosed in JP 2017-103080 A. According to the invention disclosed in JP 2017-103080 A, evaluation values $D(N)$ in a cycle time $\Delta t$ are calculated, and a cumulative evaluation value based on the evaluation value $D(n)$ is obtained. This cumulative evaluation value is used as the evaluation value $\Sigma D$ in the present embodiment. Herein, when the evaluation value $\Sigma D > 0$, the salt concentration (for example, ion concentration) is biased toward a discharge direction. When the evaluation value $\Sigma D$ is greater than or equal to a later-described discharge threshold value K1 (see FIG. 4), the salt concentration is excessively biased toward a discharge side and the secondary battery 10 results in an excessively discharged state. On the other hand, when the evaluation value $\Sigma D < 0$, the salt concentration (for example, ion concentration) is biased toward a charge direction. When the evaluation value $\Sigma D$ is less than or equal to a later-described charge threshold value K2 (see FIG. 5), the salt concentration is excessively biased toward a charge side and the secondary battery 10 results in an excessively charged state.

Herein, the state in which a salt concentration unevenness occurs in the electrolyte solution of a secondary battery due to excessive discharging of the secondary battery is referred to as an "excessively discharged state". The state in which a salt concentration unevenness occurs in the electrolyte solution due to excessive charging of the secondary battery is referred to as an "excessively charged state". On the other hand, the state in which a secondary battery is discharged beyond a predetermined lower limit of SOC (State of Charge) is referred to as an "overdischarged state". The state in which a secondary battery is discharged beyond a predetermined upper limit of SOC (State of Charge) is referred to as an "overcharged state". It should be noted that the "excessively discharged state" is different from the "overdischarged state", and the "excessively charged state" is different from the "overcharged state". The "excessively discharged state" may occur due to excessive discharging of the secondary battery, irrespective of whether or not the secondary battery is in an "overdischarged state". Likewise, the "excessively charged state" may occur due to excessive charging of the secondary battery, irrespective of whether or not the secondary battery is in an "overcharged state".

In the present embodiment, the evaluation value $\Sigma D$ includes a discharge evaluation value $\Sigma Dex1$ and a charge evaluation value $\Sigma Dex2$. It is possible that the evaluation value $\Sigma D$ may be calculated separately for the discharge evaluation value $\Sigma Dex1$ and the charge evaluation value $\Sigma Dex2$. Herein, the discharge evaluation value $\Sigma Dex1$ is a discharge-side evaluation value for high-rate deterioration of the secondary battery 10. The discharge evaluation value $\Sigma Dex1$ is an evaluation value for high-rate deterioration, which is for managing excessive discharging. The discharge evaluation value $\Sigma Dex1$ is used when the power utility grid 90 has a discharge demand (for example, a discharging request). In the present embodiment, the discharge evaluation value $\Sigma Dex1$ means the discharge-side cumulative evaluation value $\Sigma Dex1(N)$ as described in JP 2017-103080 A.

On the other hand, the charge evaluation value $\Sigma Dex2$ is a charge-side evaluation value for high-rate deterioration of the secondary battery 10. The charge evaluation value $\Sigma Dex2$ is an evaluation value for high-rate deterioration, which is for managing excessive charging. The charge evaluation value $\Sigma Dex2$ is used when the power utility grid 90 has a charge demand (for example, a charging request). In the present embodiment, the charge evaluation value $\Sigma Dex2$ means the charge-side cumulative evaluation value $\Sigma Dex2(N)$ as described in JP 2017-103080 A.

Thus, in the present embodiment, the acquisition unit 70 acquires an evaluation value $\Sigma D$ (specifically, a discharge evaluation value $\Sigma Dex1$ and a charge evaluation value $\Sigma Dex2$) of a secondary battery 10 connected to the power utility grid 90. Note that the source from which the acquisition unit 70 acquires the evaluation value $\Sigma D$ is not particularly limited. For example, the acquisition unit 70 acquires the evaluation value/D from the electric vehicle 5 that incorporates the secondary battery 10 connected to the power utility grid 90. For example, the electric vehicle 5 stores the evaluation value/D (for example, the discharge evaluation value $\Sigma Dex1$ and the charge evaluation value $\Sigma Dex2$) of the secondary battery 10. The electric vehicle 5 transmits the evaluation value $\Sigma D$ to the electric power demand adjusting device 50 via the first communication unit 61 (see FIG. 2) of the electric power demand adjusting device 50. This enables the acquisition unit 70 to acquire the evaluation value $\Sigma D$ of the secondary battery 10.

It should be noted that there may be cases where the evaluation value $\Sigma D$ for high-rate deterioration may not be stored in the electric vehicle 5. The evaluation value $\Sigma D$ is a value that is calculated based on the temperature of the secondary battery 10 and the current and voltage values during charging and discharging of the secondary battery 10. At every predetermined period, the electric vehicle 5 measures and stores the temperature of the secondary battery 10 and the current and voltage values during charging and discharging of the secondary battery 10. This enables the electric vehicle 5 to transmit the temperature of the secondary battery 10 and the current and voltage values during charging and discharging of the secondary battery 10 from the electric vehicle 5 to the electric power demand adjusting device 50. Then, the electric power demand adjusting device 50 calculates the evaluation value $\Sigma D$ based on the received temperature, current, and voltage values of the secondary battery 10. The acquisition unit 70 may acquire the evaluation value $\Sigma D$ that is calculated by the electric power demand adjusting device 50.

Figure 4:
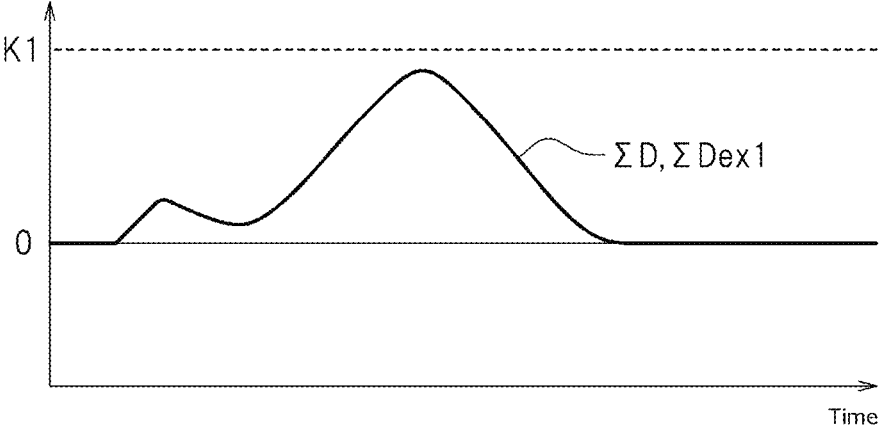
FIG. 4 is a graph illustrating a discharge evaluation value of the evaluation values and a discharge threshold value.

After the acquisition unit 70 acquires the evaluation value $\Sigma D$ in this way, the process proceeds to step S103 of FIG. 3. At step S103, the first determination unit 71 of FIG. 2 determines whether or not the evaluation value $\Sigma D$ of the secondary battery 10 is greater than or equal to a predetermined discharge threshold value K1. Here, the discharge threshold value K1 is a value that is pre-stored in the memory storage unit 60. FIG. 4 is a graph illustrating the discharge evaluation value $\Sigma Dex1$ of the evaluation value $\Sigma D$ and the discharge threshold value K1. As shown in FIG. 4, the discharge threshold value K1 is a positive value, which is set according to the battery characteristics, deterioration level, temperature, and the like of the secondary battery 10. The discharge threshold value K1 may be a constant value for all the secondary batteries 10 connected to the power utility grid 90, or may be set separately for each of the secondary batteries 10.

Herein, when each one of the secondary batteries 10 is provided with one corresponding evaluation value/D, the first determination unit 71 determines whether or not the evaluation value $\Sigma D$ is greater than or equal to the discharge threshold value K1 as described above. However, when the evaluation value $\Sigma D$ includes a discharge evaluation value $\Sigma Dex1$ and a charge evaluation value $\Sigma Dex2$, the first determination unit 71 may determine whether or not the discharge evaluation value $\Sigma Dex1$ is greater than or equal to the discharge threshold value K1 as shown in step S103 of FIG. 3.

Here, if the evaluation value $\Sigma D$ (or the discharge evaluation value $\Sigma Dex1$) is greater than or equal to the discharge threshold value K1, the process next proceeds to step S105 of FIG. 3. At step S105, the discharge non-participating process unit 76 of FIG. 2 does not allow the secondary battery 10 to participate in the adjustment of discharge demand in the power utility grid 90. When the evaluation value $\Sigma D$ is greater than or equal to the discharge threshold value K1, it means that the secondary battery 10 is excessively discharged, so further discharging may cause the high-rate deterioration to be accelerated. For this reason, the secondary batteries 10 that have an evaluation value $\Sigma D$ of greater than or equal to the discharge threshold value K1 are not allowed to participate in the adjustment of discharge demand in the power utility grid 90. It should be noted that the phrase "not allowing the secondary battery to participate in adjustment of discharge demand" means that, even when there is a request for discharge demand from the power utility grid 90 to the electric power demand adjusting device 50, the electric power demand adjusting device 50 controls a secondary battery 10 having an evaluation value $\Sigma D$ of greater than or equal to the discharge threshold value K1 so as not to discharge to the charging and discharging device 30. In the case of the adjustment of discharge demand from the power utility grid 90, a discharge demand signal is transmitted from the power utility grid 90 to the electric power demand adjusting device 50 when, for example, there is a shortage of electric power in the power utility grid 90. By receiving the discharge demand signal, the electric power demand adjusting device 50 recognizes that the power utility grid 90 is in a state of adjustment of discharge demand.

On the other hand, if, at step S103 of FIG. 3, the evaluation value $\Sigma D$ (or the discharge evaluation value $\Sigma Dex1$) is less than the discharge threshold value K1, the process next proceeds to step S107 of FIG. 3. At step S107, the second determination unit 72 of FIG. 2 determines whether or not the evaluation value $\Sigma D$ of the secondary battery 10 is less than or equal to a predetermined charge threshold value K2. Here, the charge threshold value K2 is

US 12,586,831 B2

Figure 5:
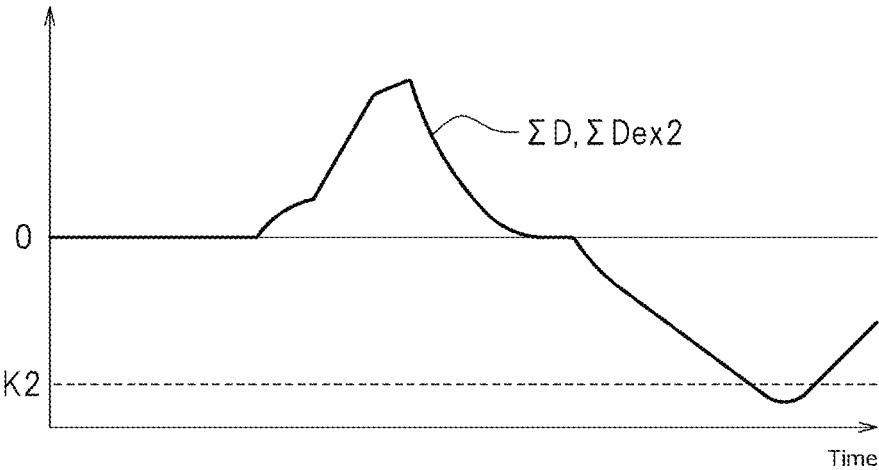
FIG. 5 is a graph illustrating a charge evaluation value of the evaluation values and a charge threshold value.

11 a value that is pre-stored in the memory storage unit 60. FIG. 5 is a graph illustrating charge evaluation value ΣDex2 of the evaluation value ΣD and the charge threshold value K2. As illustrated in FIG. 5, the charge threshold value K2 is a negative value and is less than the foregoing discharge threshold value K1. As with the discharge threshold value K1, the charge threshold value K2 is set according to the battery characteristics, deterioration level, temperature, and the like of the secondary battery 10. As with the discharge threshold value K1, the charge threshold value K2 may be a constant value for all the secondary batteries 10 connected to the power utility grid 90, or may be set differently for each of the secondary batteries 10.

Herein, when each one of the secondary batteries 10 is provided with one corresponding evaluation value/I), the second determination unit 72 determines whether or not the evaluation value ΣD is less than or equal to the charge threshold value K2 as described above. However, when the evaluation value ΣD includes a discharge evaluation value ΣDex1 and a charge evaluation value ΣDex2, the second determination unit 72 may determine whether or not the charge evaluation value ΣDex2 is less than or equal to the charge threshold value K2 as shown in step S107 of FIG. 3.

At step S107, if the evaluation value ΣD (or the charge evaluation value ΣDex2) is less than or equal to the charge threshold value K2, the process next proceeds to step S109 of FIG. 3. At step S109, the charge non-participating process unit 78 of FIG. 2 does not allow the secondary batteries 10 that have an evaluation value of less than or equal to the charge threshold value K2 from participating in the adjustment of charge demand of the power utility grid 90. When the evaluation value ΣD is less than or equal to the charge threshold value K2, it means that the secondary battery 10 is excessively charged, so further charging may cause the high-rate deterioration to be accelerated. For this reason, the secondary batteries 10 that have an evaluation value ΣD (or a charge evaluation value ΣDex2) of less than or equal to the charge threshold value K2 are not allowed to participate in the adjustment of discharge demand of the power utility grid 90. It should be noted that the phrase "not allowing the secondary battery to participate in adjustment of charge demand" means that, even when there is a request for charge demand from the power utility grid 90 to the electric power demand adjusting device 50, the electric power demand adjusting device 50 controls a secondary battery 10 having an evaluation value ΣD of less than or equal to the charge threshold value K2 so as not to be charged from the charging and discharging device 30. In the case of the adjustment of charge demand of the power utility grid 90, a charge demand signal is transmitted from the power utility grid 90 to the electric power demand adjusting device 50 when, for example, there is a surplus electric power in the power utility grid 90. By receiving the charge demand signal, the electric power demand adjusting device 50 recognizes that the power utility grid 90 is in a state of adjustment of charge demand.

On the other hand, if, at step S107 of FIG. 3, the evaluation value ΣD (or the charge evaluation value ΣDex2) is greater than the charge threshold value K2, the process next proceeds to step S111 of FIG. 3. In this case, the evaluation value ΣD is less than the discharge threshold value K1 and greater than the charge threshold value K2, which means that it is unlikely that the high-rate deterioration occurs in either case of discharging and charging. In other words, the secondary battery 10 having an evaluation value ΣD of less than the discharge threshold value K1 and greater than the charge threshold value K2 is neither excessively discharged nor excessively charged, and is therefore able to perform charging and discharging. Accordingly, at step S111, the discharge participating process unit 75 of FIG. 2 allows the secondary battery 10 to participate in the adjustment of discharge demand of the power utility grid 90. Also, the charge participating process unit 77 of FIG. 2 allows the secondary battery 10 to participate in the adjustment of charge demand in the power utility grid 90. It should be noted that the phrase "allowing the secondary battery to participate in adjustment of discharge demand (or charge demand)" means that, when there is a request for discharge demand (or charge demand) from the power utility grid 90 to the electric power demand adjusting device 50, the electric power demand adjusting device 50 controls the secondary battery 10 to allow discharging to (or charging from) the charging and discharging device 30.

In the present embodiment, at step S103 of FIG. 3, the discharge participating process unit 75 of FIG. 2 performs control such as to allow the secondary battery 10 to participate in the adjustment of discharge demand in the power utility grid 90 when the evaluation value ΣD (or the discharge evaluation value ΣDex1) is less than the discharge threshold value K1. Accordingly, at step S109, if the evaluation value ΣD is less than or equal to the charge threshold value K2, the evaluation value ΣD becomes less than the discharge threshold value K1, which is greater than the charge threshold value K2. For this reason, at step S109, the discharge participating process unit 75 allows the secondary battery 10 to participate in the adjustment of discharge demand in the power utility grid 90. In other words, the secondary battery 10 having an evaluation value ΣD of less than or equal to the charge threshold value K2 is not allowed to participate in the adjustment of charge demand in the power utility grid 90 but is allowed to participate in the adjustment of discharge demand in the power utility grid 90.

Note that when the evaluation value ΣD is less than or equal to of the charge threshold value K2, the secondary battery 10 is in an excessively charged state. In this case, the discharge participating process unit 75 allows the secondary battery 10 having an evaluation value ΣD of less than or equal to the charge threshold value K2 to participate in the adjustment of discharge demand in the power utility grid 90 first, in order to alleviate the excessively charged state. Thus, by allowing the excessively charged secondary battery 10 to be discharged, the evaluation value ΣD increases, for example. Then, when, after allowing the secondary battery 10 to participate in the adjustment of discharge demand, when the evaluation value ΣD becomes greater than or equal to a predetermined threshold value, the charge participating process unit 77 allows the secondary battery 10 to participate in the adjustment of charge demand. The predetermined threshold value is less than or equal to the discharge threshold value K1 and greater than or equal to the charge threshold value K2. Thus, in the case of excessive charge, the secondary battery 10 is allowed to participate in the adjustment of discharge demand to increase the evaluation value ΣD and thereafter allowed to participate in the adjustment of charge demand. This enables efficient charging and discharging of the secondary battery 10 while reducing high-rate deterioration.

In the present embodiment, at step S107 of FIG. 3, the discharge participating process unit 77 of FIG. 2 performs control such as to allow the secondary battery 10 to participate in the adjustment of charge demand in the power utility grid 90 when the evaluation value ΣD (or the charge evaluation value ΣDex2) is greater than the charge threshold value K2. At step S105, if the evaluation value ΣD is greater than or equal to the discharge threshold value K1, the evaluation value $\Sigma D$ becomes greater than the charge threshold value K2, which is less than the discharge threshold value K1. For this reason, at step S107, the charge participating process unit 77 allows the secondary battery 10 to participate in the adjustment of charge demand in the power utility grid 90. In other words, the secondary battery 10 having an evaluation value $\Sigma D$ of greater than or equal to the discharge threshold value K1 is not allowed to participate in the adjustment of discharge demand in the power utility grid 90, but is allowed to participate in the adjustment of charge demand in the power utility grid 90.

Note that when the evaluation value $\Sigma D$ is greater than or equal to the discharge threshold value K1, the secondary battery 10 is in an excessively discharged state. In this case, the charge participating process unit 77 allows the secondary battery 10 having an evaluation value $\Sigma D$ of greater than or equal to discharge threshold value K1 to participate in the adjustment of charge demand in the power utility grid 90 preferentially, in order to alleviate the excessively discharged state. Thus, by allowing the excessively discharged secondary battery 10 to be charged, the evaluation value $\Sigma D$ decreases. Then, when, after allowing the secondary battery 10 to participate in the adjustment of charge demand, the evaluation value $\Sigma D$ becomes less than or equal to a predetermined threshold value (a threshold value that is less than or equal to the discharge threshold value K1 and greater than or equal to the charge threshold value K2), the charge participating process unit 75 allows the secondary battery 10 to participate in the adjustment of discharge demand. Thus, in the case of excessive discharge, the secondary battery 10 is allowed to participate in the adjustment of charge demand to decrease the evaluation value $\Sigma D$ and thereafter allowed to participate in the adjustment of charge demand. This enables efficient charging and discharging of the secondary battery 10 while the reducing high-rate deterioration.

For example, it is possible that, when the demand from the power utility grid 90 is a discharge demand, the number of the secondary batteries 10 connected to the power utility grid 90, in other words, the number of the secondary batteries 10 that are controlled to be discharged, may be limited. In that case, the electric power demand adjusting device 50 may control such that the secondary batteries 10 having a lower evaluation value $\Sigma D$ (or discharge evaluation value $\Sigma Dex1$) are allowed to be connected to the power utility grid 90 preferentially to discharge to the charging and discharging device 30. It is also possible that, when the demand from the power utility grid 90 is a charge demand, the number of the secondary batteries 10 connected to the power utility grid 90, in other words, the number of the secondary batteries 10 that are controlled to be charged, may be limited. In that case, the electric power demand adjusting device 50 may control such that the secondary batteries 10 having a higher evaluation value $\Sigma D$ (or discharge evaluation value $\Sigma Dex2$) are allowed to be connected to the power utility grid 90 preferentially to be charged from the charging and discharging device 30.

In the foregoing, the evaluation value $\Sigma D$ for high-rate deterioration is used to determine which one(s) of the secondary batteries 10 is to be the target of controlling of discharging or charging at the time of a discharge demand or a charge demand in the power utility grid 90. However, the state of charge (hereinafter abbreviated as SOC) of a secondary battery 10 may also be used to determine which one(s) of the secondary batteries 10 is to be the target of controlling of discharging or charging at the time of a discharge demand or a charge demand in the power utility grid 90. Next, the description explains the procedure of controlling charging and discharging of the secondary batteries 10 mounted in the electric vehicles 5 according to an electric power demand (for example, a discharge demand and a charge demand) from the power utility grid 90 while considering the SOC of the secondary battery 10, with reference to the flowchart of FIG. 6. Here, as illustrated in FIG. 1, charging and discharging of the secondary batteries 10 are controlled for the electric vehicles 5 connected to the power utility grid 90, according to the electric power demand of the electric vehicles 5 connected to the connectors 31 of the charging and discharging devices 30, that is, the electric power demand of the power utility grid 90.

Figure 6:
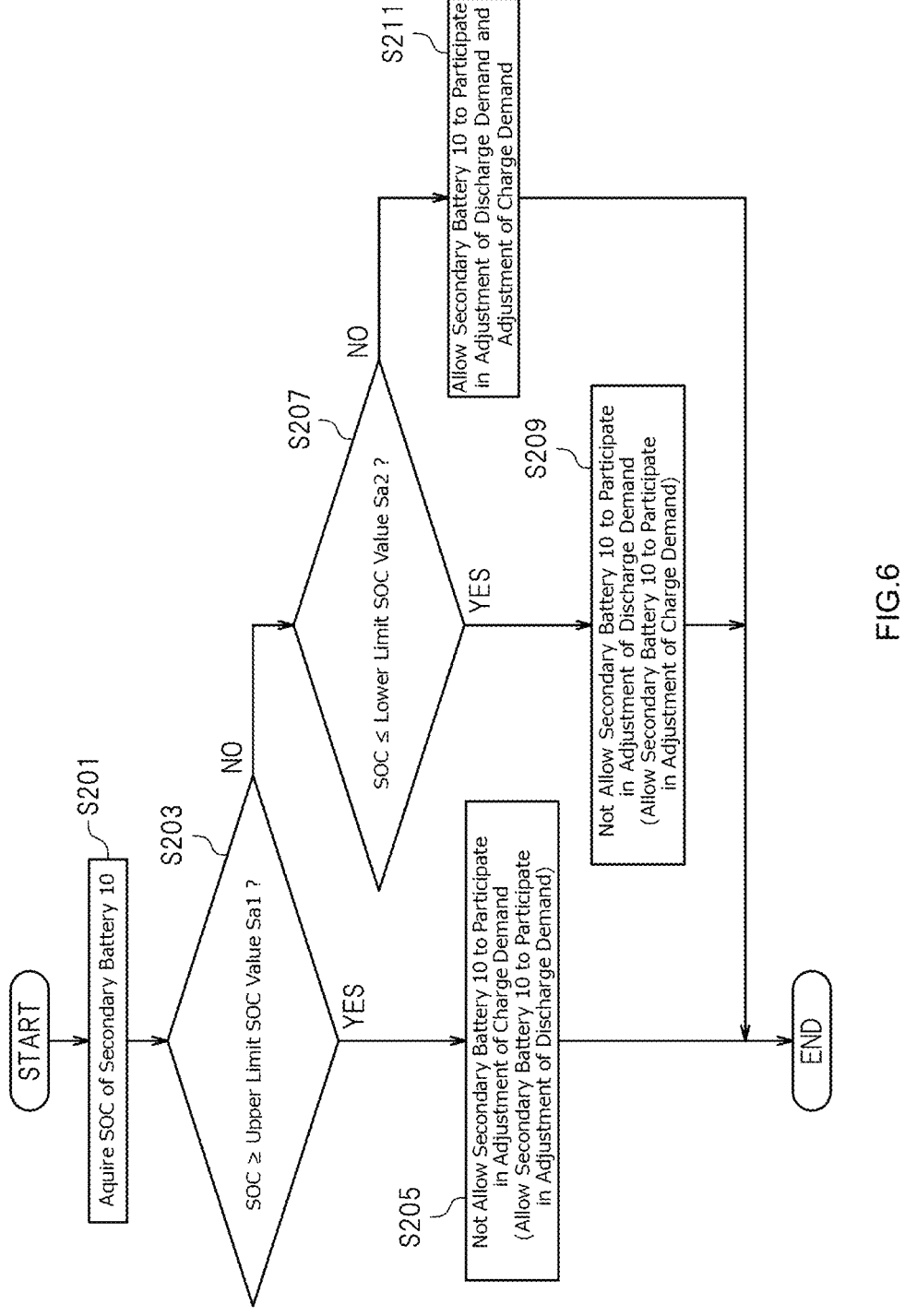
FIG. 6 is a flowchart illustrating the procedure of controlling charging and discharging of a secondary battery mounted in an electric vehicle while considering SOC of the secondary battery.

First, at step S201 of FIG. 6, the acquisition unit 70 of FIG. 2 acquires the SOC of a secondary battery 10 connected to the power utility grid 90. Note that the specific method for acquiring the SOC of the secondary battery 10 by the acquisition unit 70 is not particularly limited. For example, the acquisition unit 70 acquires the SOC from an electric vehicle 5 that incorporates the secondary battery 10 connected to the power utility grid 90. For example, the electric vehicle 5 stores the information about the SOC of the secondary battery 10. The electric vehicle 5 transmits the information about the SOC to the electric power demand adjusting device 50 via the first communication unit 61 (see FIG. 2) of the electric power demand adjusting device 50. This enables the acquisition unit 70 to acquire the SOC of the secondary battery 10.

After the acquisition unit 70 has acquired the SOC of the secondary battery 10 in this way, the first determination unit 71 of FIG. 2 determines, at step S203 of FIG. 6, whether or not the SOC of the secondary battery 10 is greater than or equal to a predetermined upper limit SOC value Sa1. Here, the upper limit SOC value Sa1 is a value that is pre-stored in the memory storage unit 60. The upper limit SOC value Sa1 is a value indicating a fully charged state of the secondary battery 10. The upper limit SOC value Sa1 may be a constant value for all the secondary batteries 10 connected to the power utility grid 90, or may be set separately for each of the secondary batteries 10.

Here, if the SOC of the secondary battery 10 is greater than or equal to the upper limit SOC value Sa1, the process next proceeds to step S205 of FIG. 6. At step S205, the charge non-participating process unit 78 of FIG. 2 does not allow the secondary batteries 10 having a SOC of greater than or equal to the upper limit SOC value Sa1 to participate in the adjustment of charge demand of the power utility grid 90 because the secondary batteries 10 are in a fully charged state. However, the secondary batteries 10 that are in a fully charged state are able to discharge. Therefore, at step S205, the discharge participating process unit 75 of FIG. 2 allows the secondary batteries 10 having a SOC greater than or equal to the upper limit SOC value Sa1 to participate in the adjustment of discharge demand of the power utility grid 90.

On the other hand, at step S203 of FIG. 6, if the SOC of the secondary battery 10 is less than the upper limit SOC value Sa1, the process next proceeds to step S207 of FIG. 6. At step S207, the second determination unit 72 of FIG. 2 determines whether or not the SOC of the secondary battery 10 is less than or equal to a predetermined lower limit SOC value Sa2. Here, the lower limit SOC value Sa2 is a value that is pre-stored in the memory storage unit 60. The lower limit SOC value Sa2 is less than the upper limit SOC value Sa1. The lower limit SOC value Sa2 is a value indicating an insufficient charge state of the secondary battery 10. The lower limit SOC value Sa2 may be a constant value for all the secondary batteries 10 connected to the power utility grid 90, or may be set separately for each of the secondary batteries 10.

On the other hand, at step S207 of FIG. 6, if the SOC of the secondary battery 10 is less than or equal to the lower limit SOC value Sa2, the process next proceeds to step S209 of FIG. 6. At step S209, the discharge non-participating process unit 76 of FIG. 2 does not allow the secondary batteries 10 having a SOC of lower than or equal to the lower limit SOC value Sa2 to participate in the adjustment of charge demand of the power utility grid 90 because the secondary batteries 10 are in an insufficient charge state. However, the secondary batteries 10 that are in an insufficient charge state are able to be charged in order to resolve the shortage of charge. Therefore, at step S209, the charge participating process unit 77 of FIG. 2 allows the secondary batteries 10 having a SOC lower than or equal to the lower limit SOC value Sa2 to participate in the adjustment of charge demand of the power utility grid 90.

On the other hand, at step S207 of FIG. 6, if the SOC of the secondary battery 10 is greater than the lower limit SOC value Sa2, the process next proceeds to step S211 of FIG. 6. At step S211, the SOC of the secondary battery 10 is less than the upper limit SOC value Sa1 and greater than the lower limit SOC value Sa2. This enables both charging and discharging for the secondary battery 10. Accordingly, at step S211, the discharge participating process unit 75 of FIG. 2 allows the secondary battery 10 to participate in the adjustment of discharge demand of the power utility grid 90. Also, the charge participating process unit 77 of FIG. 2 allows the secondary battery 10 to participate in the adjustment of charge demand in the power utility grid 90.

In the present embodiment, there is no correlation between the evaluation value ΣD for high-rate deterioration and the SOC of the secondary battery 10. Here, the secondary battery 10 is allowed to participate in the adjustment of discharge demand of the power utility grid 90 only when it is determined to allow the secondary battery 10 to participate in the adjustment of discharge demand of the power utility grid 90 in both the determination for the evaluation value ΣD shown in the flowchart of FIG. 3 and the determination for the SOC of the secondary battery 10 shown in the flowchart of FIG. 6. That is, the secondary battery 10 is not allowed to participate in the adjustment of discharge demand of the power utility grid 90 if it is determined not to allow the secondary battery 10 to participate in the adjustment of discharge demand in one of the determination for the evaluation value ΣD and the determination for the SOC of the secondary battery 10 but it is determined to allow the secondary battery 10 to participate in the adjustment of discharge demand in the other one. In addition, the secondary battery 10 is allowed to participate in the adjustment of charge demand of the power utility grid 90 only when it is determined to allow the secondary battery 10 to participate in the adjustment of charge demand of the power utility grid 90 both in the determination for the evaluation value ΣD and the determination for the SOC of the secondary battery 10. That is, the secondary battery 10 is not allowed to participate in the adjustment of charge demand of the power utility grid 90 if it is determined not to allow the secondary battery 10 to participate in the adjustment of charge demand in one of the determination for the evaluation value ΣD and the determination for the SOC of the secondary battery 10 but it is determined to allow the secondary battery 10 to participate in adjustment of charge demand in the other one.

The present embodiment does not particularly limit the sequence in which the determination for the evaluation value ΣD as shown in the flowchart of FIG. 3 and the determination for the SOC of the secondary battery 10 as shown in the flowchart of FIG. 6 are conducted. For example, the determination using the SOC of the secondary battery 10 as shown in the flowchart of FIG. 6 may be performed after the determination using the evaluation value ΣD as shown in the flowchart of FIG. 3. It is also possible that the determination using the evaluation value ΣD as shown in the flowchart of FIG. 3 may be performed after the determination using the SOC of the secondary battery 10 as shown in the flowchart of FIG. 6.

As has been described above, in the present embodiment, the electric power adjusting device 50 is configured to execute an acquiring process and a discharge non-participating process. The acquiring process is executed by the acquisition unit 70 of FIG. 2. As indicated by step S101 of FIG. 3, the acquiring process acquires an evaluation value ΣD for a high-rate deterioration of a secondary battery 10 connected to the power utility grid 90, which results from a salt concentration unevenness in the electrolyte solution of the secondary battery 10. The discharge non-participating process is executed by the discharge non-participating process unit 76 of FIG. 2. As indicated by step S105 of FIG. 3, the discharge non-participating process does not allow the secondary battery 10 to participate in the adjustment of discharge demand in the power utility grid 90 when the evaluation value ΣD of the secondary battery 10 is greater than or equal to a predetermined discharge threshold value K1. For example, when the evaluation value ΣD for the high-rate deterioration is great, the secondary battery 10 is in an excessively discharged state. If the excessively discharged secondary battery 10 is further discharged, the high-rate deterioration is likely to be accelerated. Therefore, in the present embodiment, when the evaluation value ΣD is greater than or equal to the discharge threshold value K1, the secondary battery 10 is not allowed to participate in the adjustment of discharge demand in the power utility grid 90, to thereby reduce the high-rate deterioration of the secondary battery 10.

In the present embodiment, the electric power adjusting device 50 is configured to execute a charge non-participating process. The charge non-participating process is executed by the charge non-participating process unit 78 of FIG. 2. As indicated by step S109 of FIG. 3, the charge non-participating process does not allow the secondary battery 10 to participate in the adjustment of charge demand in the power utility grid 90 when the evaluation value ΣD of the secondary battery 10 is less than or equal to a predetermined charge threshold value K2. For example, when the evaluation value ΣD for the high-rate deterioration is low, the secondary battery 10 is in an excessively charged state. If the excessively charged secondary battery 10 is further charged, the high-rate deterioration is likely to be accelerated. Therefore, in the present embodiment, when the evaluation value ΣD is less than or equal to the charge threshold value K2, the secondary battery 10 is not allowed to participate in the adjustment of charge demand in the power utility grid 90, to thereby reduce the high-rate deterioration of the secondary battery 10.

As indicated by step S101 of FIG. 3, the acquiring process according to the present embodiment includes acquiring a discharge evaluation value ΣDex1 of the secondary battery 10, which is the evaluation value ΣD on a discharge side, and a charge evaluation value ΣDex2 of the secondary battery 10, which is the evaluation value ΣD on a charge side. As indicated by step S105 of FIG. 3, the discharge non-participating process does not allow the secondary battery 10 to participate in the adjustment of discharge demand in the power utility grid 90 when the evaluation value ΣDex1 is greater than or equal to the discharge threshold value K1. As indicated by step S109 of FIG. 3, the charge non-participating process does not allow the secondary battery 10 to participate in the adjustment of charge demand in the power utility grid 90 when the charge evaluation value ΣDex2 is less than or equal to the charge threshold value K2. Thus, when the determination is made using the discharge evaluation value ΣDex1 and the discharge threshold value K1, it is possible to appropriately determine whether or not the secondary battery 10 is excessively discharged. As a result, the high-rate deterioration resulting from excessive discharging can be further reduced. Also, when the determination is made using the charge evaluation value ΣDex2 and the charge threshold value K2, it is possible to appropriately determine whether or not the secondary battery 10 is excessively charged. As a result, the high-rate deterioration resulting from excessive charging can be further reduced.

In the present embodiment, as indicated by step S101 of FIG. 3, the acquiring process acquires an evaluation value ΣD for each of the secondary batteries 10 connected to the power utility grid 90. The electric power adjusting device 50 is configured to execute a discharge participating process. The discharge participating process is executed by the discharge participating process unit 75 of FIG. 2. As indicated by step S111 of FIG. 3, the discharge participating process allows one or more of the plurality of secondary batteries 10 having an evaluation value ΣD of less than the discharge threshold value K1 to participate in the adjustment of discharge demand in the power utility grid 90. When the evaluation value ΣD is less than the discharge threshold value K1, it means that the secondary battery 10 is not excessively discharged. For this reason, when the evaluation value ΣD is less than the discharge threshold value K1, the secondary battery 10 is allowed to participate in the adjustment of discharge demand in the power utility grid 90, to thereby allow the secondary battery 10 to be discharged while reducing the high-rate deterioration.

In the present embodiment, the electric power adjusting device 50 is configured to execute a charge participating process. The charge participating process is executed by the charge participating process unit 77 of FIG. 2. As indicated by step S105 of FIG. 3, the charge participating process allows one or more of the plurality of secondary batteries 10 having an evaluation value ΣD of greater than or equal to the discharge threshold value K1 to participate in the adjustment of charge demand in the power utility grid 90. When the excessively discharged secondary batteries 10 are charged in this way, the evaluation value ΣD can be decreased. As a result, the excessively discharged state can be resolved quickly.

In the present embodiment, as indicated by step S111 of FIG. 3, the charge participating process allows one or more of the plurality of secondary batteries 10 having an evaluation value ΣD of greater than the charge threshold value K2 to participate in the adjustment of charge demand in the power utility grid 90. When the evaluation value/D is greater than the charge threshold value K2, it means that the secondary battery 10 is not excessively charged. For this reason, when the evaluation value ΣD is greater than the charge threshold value K2, the secondary battery 10 is allowed to participate in the adjustment of charge demand in the power utility grid 90, to thereby allow the secondary battery 10 to be charged while reducing the high-rate deterioration.

In the present embodiment, as indicated by step S109 of FIG. 3, the discharge participating process allows one or more of the plurality of secondary batteries 10 having an evaluation value ΣD of lower than or equal to the charge threshold value K2 to participate in the adjustment of discharge demand in the power utility grid 90. When the excessively charged secondary batteries 10 are discharged in this way, the evaluation value ΣD can be increased. As a result, the excessively charged state can be resolved quickly.

What is claimed is:

1. An electric power demand adjusting device configured to execute:

an acquiring process of acquiring an evaluation value for a high-rate deterioration of a secondary battery connected to a power utility grid, the high-rate deterioration resulting from a salt concentration unevenness in an electrolyte solution of the secondary battery; and a discharge non-participating process of not allowing the secondary battery to participate in adjustment of discharge demand in the power utility grid in response to the evaluation value of the secondary battery being greater than or equal to a predetermined discharge threshold value, wherein the predetermined discharge threshold value is a positive value.

2. The electric power demand adjusting device according to claim 1, configured to further execute a charge non-participating process of not allowing the secondary battery to participate in adjustment of charge demand in the power utility grid in response to the evaluation value of the secondary battery being less than or equal to a predetermined charge threshold value, wherein the predetermined charge threshold value is a negative value.

3. The electric power demand adjusting device according to claim 1, configured to further execute a charge non-participating process of not allowing the secondary battery to participate in adjustment of charge demand in the power utility grid in response to the evaluation value of the secondary battery being less than or equal to a predetermined charge threshold value, wherein the predetermined charge threshold value is a negative value, wherein:

the acquiring process includes acquiring, as the evaluation value, a discharge evaluation value and a charge evaluation value of the secondary battery, the discharge evaluation value being a discharge-side evaluation value of the secondary battery and the charge evaluation value being a charge-side evaluation value of the secondary battery;

in the discharge non-participating process, the secondary battery is not allowed to participate in the adjustment of discharge demand in the power utility grid in response to the discharge evaluation value being greater than or equal to the predetermined discharge threshold value; and in the charge non-participating process, the secondary battery is not allowed to participate in the adjustment of charge demand in the power utility grid in response to the charge evaluation value being less than or equal to the predetermined charge threshold value.

4. An electric power demand adjusting device configured to execute:

an acquiring process of acquiring an evaluation value for a high-rate deterioration of each of a plurality of secondary batteries connected to a power utility grid, the high-rate deterioration resulting from a salt concentration unevenness in an electrolyte solution of each of the secondary batteries; and a discharge participating process of allowing one or more of the plurality of secondary batteries having the evaluation value less than a predetermined discharge threshold value to participate in adjustment of discharge demand in the power utility grid, wherein the predetermined discharge threshold value is a positive value.

5. The electric power demand adjusting device according to claim 4, configured to further execute a charge participating process of allowing one or more of the plurality of secondary batteries having the evaluation value greater than or equal to the predetermined discharge threshold value to participate in adjustment of charge demand in the power utility grid.

6. The electric power demand adjusting device according to claim 5, wherein, in the charge participating process, one or more of the plurality of the secondary batteries having the evaluation value greater than a predetermined charge threshold value is allowed to participate in adjustment of charge demand in the power utility grid, and the predetermined charge threshold value is a negative value.

7. An electric power demand adjusting device configured to execute:

an acquiring process of acquiring an evaluation value for a high-rate deterioration of each of a plurality of secondary batteries connected to a power utility grid, the high-rate deterioration resulting from a salt concentration unevenness in an electrolyte solution of each of the secondary batteries; and a charge participating process of allowing one or more of the plurality of secondary batteries having the evaluation value greater than a predetermined charge threshold value to participate in adjustment of charge demand in the power utility grid, wherein the predetermined charge threshold value is a negative value.

8. The electric power demand adjusting device according to claim 7, configured to further execute a discharge participating process of allowing one or more of the plurality of secondary batteries having the evaluation value less than or equal to the predetermined charge threshold value to participate in adjustment of discharge demand in the power utility grid.

* * * * *